(12) United States Patent
Inoue et al.

(10) Patent No.: US 8,710,569 B2
(45) Date of Patent: Apr. 29, 2014

(54) SEMICONDUCTOR DEVICE AND MANUFACTURING METHOD THEREOF

(75) Inventors: Ken Inoue, Tokyo (JP); Masayuki Hamada, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 160 days.

(21) Appl. No.: 13/344,552

(22) Filed: Jan. 5, 2012

(65) Prior Publication Data

US 2012/0104481 A1    May 3, 2012

Related U.S. Application Data

(60) Continuation of application No. 11/030,203, filed on Jan. 7, 2005, now Pat. No. 8,101,986, which is a continuation of application No. 10/901,124, filed on Jul. 29, 2004, now Pat. No. 8,610,219, which is a division of application No. 09/667,706, filed on Sep. 22, 2000, now Pat. No. 6,815,281.

(30) Foreign Application Priority Data

Oct. 27, 1999    (JP) ..................................... 11-305702

(51) Int. Cl.
*H01L 27/108*    (2006.01)
*H01L 29/94*    (2006.01)

(52) U.S. Cl.
USPC ........... 257/306; 257/307; 257/311; 257/330; 257/332; 257/334; 257/384; 257/532; 257/534; 257/E27.086; 257/E27.088; 438/200; 438/199; 438/218; 438/221; 438/225; 438/230; 438/231; 438/232; 438/233

(58) Field of Classification Search
USPC ......... 257/306, 307, 311, 330–332, 334, 384, 257/532–534, E27.06, E27.086, E27.088, 257/E27.096; 438/200, 199, 218, 221, 225, 438/230–233

See application file for complete search history.

(56) References Cited

U.S. PATENT DOCUMENTS

| 4,717,684 A | 1/1988 | Katto et al. |
| 5,250,456 A | 10/1993 | Bryant |

(Continued)

FOREIGN PATENT DOCUMENTS

| JP | 04-032260 | 2/1992 |
| JP | 07-038104 | 2/1995 |

(Continued)

OTHER PUBLICATIONS

Korean Office Action dated Apr. 29, 2002 with Japanese translation and partial English translation.

(Continued)

*Primary Examiner* — Meiya Li
(74) *Attorney, Agent, or Firm* — McGinn IP Law Group, PLLC

(57) ABSTRACT

A semiconductor device includes a semiconductor substrate including a DRAM portion and a logic portion thereon, an interlayer film covering the DRAM portion and logic portion of the semiconductor substrate, and plural contact plugs formed in the interlayer film in the DRAM portion and the logic portion, the plural contact plugs being in contact with a metal suicide layer on a highly-doped region of source and drain regions of first, second and third transistors in the DRAM portion and the logic portion, an interface between the plural contact plugs and the metal silicide layer being formed at a main surface in the DRAM portion and the logic portion.

17 Claims, 6 Drawing Sheets

(56) References Cited

U.S. PATENT DOCUMENTS

| | | |
|---|---|---|
| 5,313,101 A | 5/1994 | Harada et al. |
| 5,323,343 A | 6/1994 | Ogoh et al. |
| 5,843,817 A | 12/1998 | Lee et al. |
| 5,864,161 A | 1/1999 | Mitani et al. |
| 5,895,239 A * | 4/1999 | Jeng et al. ............ 438/239 |
| 5,981,324 A | 11/1999 | Seo et al. |
| 5,998,251 A | 12/1999 | Wu et al. |
| 6,025,620 A | 2/2000 | Kimura et al. |
| 6,025,634 A | 2/2000 | Teong |
| 6,074,908 A | 6/2000 | Huang |
| 6,107,154 A | 8/2000 | Lin |
| 6,117,723 A | 9/2000 | Huang |
| 6,130,463 A * | 10/2000 | Oda et al. ............ 257/384 |
| 6,150,248 A | 11/2000 | Sekiguchi et al. |
| 6,190,957 B1 | 2/2001 | Mochizuki et al. |
| 6,200,834 B1 | 3/2001 | Bronner et al. |
| 6,214,676 B1 | 4/2001 | Jun et al. |
| 6,300,206 B1 | 10/2001 | Fukada et al. |
| 6,303,432 B1 | 10/2001 | Horita et al. |
| 6,337,237 B1 | 1/2002 | Basceri et al. |
| 6,436,753 B1 | 8/2002 | Ikeda et al. |
| 6,485,988 B2 | 11/2002 | Ma et al. |
| 6,579,784 B1 | 6/2003 | Huang |
| 2002/0014660 A1 | 2/2002 | Noble et al. |

FOREIGN PATENT DOCUMENTS

| | | |
|---|---|---|
| JP | 07-249763 | 9/1995 |
| JP | 09-153595 | 6/1997 |
| JP | 09-153616 | 6/1997 |
| JP | 09-219501 | 8/1997 |
| JP | 10-335480 | 12/1998 |
| JP | 11-008361 | 1/1999 |
| JP | 11-017129 | 1/1999 |
| JP | 11-017141 | 1/1999 |
| JP | 11-026711 | 1/1999 |
| JP | 11-097649 | 4/1999 |
| JP | 11-111974 | 4/1999 |
| JP | 11-177085 | 7/1999 |
| JP | 11-214656 | 8/1999 |
| JP | 2001-057347 | 2/2001 |

OTHER PUBLICATIONS

Japanese Office Action dated Oct. 15, 2003 with partial translation.
Japanese Office Action dated Aug. 3, 2010 with a partial English translation.
Donald A Neamen, "Semiconductor Physics & Devices Basic Principles", 1992 and 1997, The McGraw-Hill Companies, Inc., Second Edition, pp. 512-514.
Stanley Wolf Ph.D., Silicon Processing for the VLSI ERA vol. 2: Process Integration, Lattice Press, pp. 354-359.
Japanese Office Action dated Mar. 2, 2010 with an English translation.
Japanese Office Action dated Nov. 24, 2009 with an English translation.
Japanese Office Action dated Mar. 28, 2007.
United States Office Action dated May 14, 2013 in U.S. Appl. No. 10/901,124.

* cited by examiner

SEMICONDUCTOR DEVICE AND MANUFACTURING METHOD THEREOF

CROSS-REFERENCE TO RELATED APPLICATIONS

This application is a Continuation Application of U.S. patent application Ser. No. 11/030,203 filed on Jan. 7, 2005 now U.S. Pat. No. 8,101,986, which is a Continuation Application of U.S. patent application Ser. No. 10/901,124 filed on Jul. 29, 2004 now U.S. Pat. No. 8,610,219, which is a Divisional Application of U.S. patent application Ser. No. 09/667,706, filed on Sep. 22, 2000, now U.S. Pat. No. 6,815,281, which claims priority to Japanese Patent Application No. 1999-305702, filed on Oct. 27, 1999, the entire contents of which are incorporated by reference.

BACKGROUND OF THE INVENTION

1. Field of the Invention

The present invention relates to a semiconductor device and a manufacturing method thereof and more particularly to an improvement on a SOC (System On Chip) that has a logic (logic circuit) and a DRAM (Dynamic Random Access Memory) together on one and the same substrate.

2. Description of the Related Art

In a general purpose DRAM (having, on one chip, only a memory section and an adjacent circuit section which comprises a decoder, a sense amplifier, an I/O (input/output) circuit and the like), hold characteristics of memory cells have been, hitherto, regarded as the matter of great importance so that it has become a common practice to set the dopant concentration in the source-drain regions of cell transistors lower than that in the adjacent circuit section for the purpose of achieving the suppression of the junction leakage current.

Meanwhile, in recent years, demands that image processing using computer graphics should be made at a higher speed have been growing. Accordingly, there has been proposed a DRAM-incorporated logic chip as shown in FIG. 9, a so-called SOC 31 which has a DRAM section 32 comprising memory cells 33 and adjacent circuits 34 such as a decoder and a sense amplifier, a logical operation section (a logic section) 35 where graphic processing is carried out at a high speed, and, in addition, an I/O section 36 which connects these DRAM and logic sections with an external circuit, all together on one chip.

In the DRAM section thereof, to suppress the short channel effect and relax the centralization of the drain field, the dopant concentration in the source-drain (S/D) should be, hitherto, set low. This makes the junction in the S/D regions shallow and, as has been pointed out, the silicidation therein may bring about an increase in the leakage currents In light of this problem, several techniques of making silicidation in the DRAM section have been proposed.

For example, Japanese Patent Application Laid-open No. 97649/1999 discloses the methods using the following SOC structures: that is, (1) a structure (first embodiment) wherein, while the dopant concentration in S/D regions of a memory cell region in a DRAM section is set low to make the leakage small, dopants are implanted into S/D regions of an adjacent circuit region to a high concentration, and besides silicide layers are formed on gate surfaces and the surfaces of active regions, and thereby high-speed operations become attainable; (2) a structure (second embodiment) wherein, in a DRAM cell section, S/D regions (low dopant-concentration regions) with which capacitor contacts are connected are set as non-silicide regions, and silicide layers are formed only on the surfaces of S/D regions (low dopant-concentration regions) with which bit line contacts are connected and on the gate surfaces of cell transistors, whereby the interconnection resistance and the contact resistance are reduced, and reading and writing operations at a higher speed are made attainable; and (3) a structure (third embodiment) wherein, in a DRAM memory cell section, portions of a TEOS (Tetra-Ethyl-Ortho-Silicate) oxide film that is first laid at the time of formation of transistor sidewalls are selectively left at the edge of LOCOS (Local Oxidation of Silicon), or in the vicinity of bird's beaks, and thereafter silicide layers are formed on the entire surface of the DRAM memory cell section but said portions, in the same way as for cell gates and a logic section, and thereby reading and writing operations at a higher speed are made attainable, while the junction leakage is kept low. As an example, the third embodiment in said publication is now described in detail with reference to a schematic cross-sectional view of a memory cell section shown in FIG. 10. A semiconductor substrate 41 is isolated into elements by isolation oxide films 42 and a memory cell transistor is formed between these films. Silicide layers 49 are formed on the surfaces of the gate electrodes 48 and in regions where a contact 52a connecting with a bit line 51 and contacts 52b connecting with storage nodes 53 are in contact with the semiconductor substrate 42, respectively. These silicide layers lying on the substrate are formed within low dopant-concentration regions 47. At the edge sections of the isolation oxide films 42, there are formed TEOS oxide films 50, protecting these edge sections from silicidation, so that silicide layers may not be formed beneath the isolation oxide films 42 or the junction leakage may not be generated around the edges thereof. In the drawing, 43-45 each represents an interlayer insulating film; 46, gate oxide films; 54, a dielectric film and 55, a cell plate.

Further, Japanese Patent Application Laid-open No. 17129/1999 discloses a structure wherein, after S/D regions of transistors in a DRAM cell section and a logic section are formed in separate steps, respectively, and contact-holes that reach S/D regions of transistors for cell selection are formed, silicide layers are formed on the surfaces of the S/D regions through said contact-holes so that conductive films are buried in the contact-holes. In this instance, silicide layers are also formed in the S/D regions of transistors in the logic section but this silicidation is carried out in a different step from the one for silicidation of the S/D regions of transistors for cell selection. Further, it is therein mentioned that silicidation can be also applied to the gate surfaces in another step.

In any of these conventional techniques, the S/D regions of DRAM cell transistors are still formed to have a low dopant concentration, while the S/D regions of transistors in the logic section, a high dopant concentration. In other words, a SOC structure of this sort is designed under the concept that a high-speed logic is made incorporated into an existing DRAM. This assumes fabrication of the DRAM section and the logic section in separate steps and, thus, a reduction of the production cost cannot be much expected to happen. However, the SOC is, by nature, designed and manufactured for each system application. In comparison with the general purpose DRAM, a small quantity and a large diversity characterize its production, and, therefore, the cost reduction has a particular significance.

SUMMARY OF THE INVENTION

An object of the present invention is, therefore, with such a pre-concept relinquished, to provide a manufacturing method that can produce, with low cost, an SOC having necessary and sufficient characteristics in the DRAM section, while attaining higher-speed performance of the whole elements therein, on the basis of a novel concept that a DRAM is made incorporated into a high-speed logic, and a structure of the SOC thereat.

Accordingly, the present invention relates to a DRAM-incorporated semiconductor device which has a DRAM section and a logic section being formed on one and the same substrate, wherein suicide layers are formed, at least, on all the surfaces of the source-drain regions and the gate surfaces of transistors in the DRAM section and the logic section. Further, the present invention relates to a method of manufacturing a DRAM-incorporated semiconductor device in which a DRAM section and a logic section are formed on a semiconductor substrate that is isolated into elements, wherein silicidation of all the surfaces of the source-drain regions and the gate surfaces that constitute transistors in the DRAM section and the logic section is carried out concurrently in one and the same step.

Further, the present invention relates to a semiconductor device having a memory cell section and an adjacent circuit section, wherein silicide layers are formed on all the surfaces of the source-drain regions and the gate surfaces of transistors in the memory cell section and the adjacent circuit section.

In the present invention, the source-drain regions in the DRAM section are made high dopant-concentration regions and consequently, through silicidation of all the surfaces of said regions and the gate surfaces, good ohmic contacts can be formed. Further, the formation of silicide can be carried out concurrently with silicidation in the logic section in one and the same step. Therefore, an increase in the number of the steps in a manufacturing method can be avoided, and both higher-speed performance of the whole elements and lower cost production can be realized.

DETAILED DESCRIPTION OF THE PREFERRED EMBODIMENTS

Figure 1:
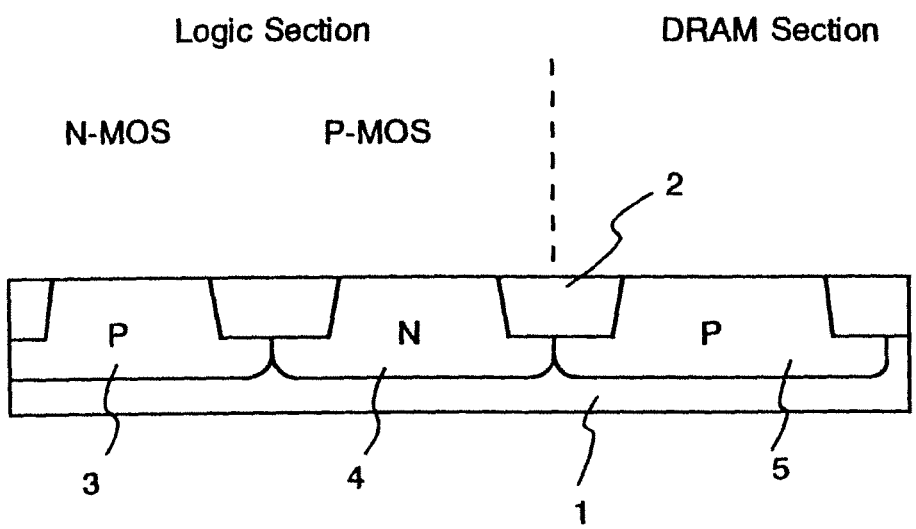
FIGS. 1-8 are a series of schematic cross-sectional views illustrating the steps of a manufacturing method of a semiconductor device that is one embodiment of the present invention.

Referring to the drawings, the present invention is described in detail below. FIGS. 1-8 are a series of schematic cross-sectional views illustrating the steps of a manufacturing method of a semiconductor device that is one embodiment of the present invention.

First, onto a Si substrate 1, buried oxide films 2 are formed by the known method of trench isolation so as to isolate an N-MOS (N-Metal-Oxide-Semiconductor) and a P-MOS of a logic section and a DRAM section each as an element. Next, over the surface of the substrate 1, a thin oxide film (a $SiO_2$: sacrifice oxide film, not shown in the drawing) is formed by thermal oxidation, and then the channel ion implantation for forming P-channels and N-channels to the logic section and adjacent circuits which comprise a decoder and a sense amplifier in the DRAM section, an I/O circuit and the like, and forming N-channels to memory cells, together with the ion implantation for forming respective wells (a P-well 3, an N-well 4 and a cell P-well 5) are performed. This accomplishes formation of the structure shown in FIG. 1. Although FIG. 1 shows, for the sake of simplification, only respective wells, buried oxide films 2 for element isolation and a memory cell in the DRAM section, it is apparent that the present invention is not limited to this structure. Further, the ion implantation for the cell P-well 5 and the P-well 3 may be performed simultaneously or separately. A deep N-well may be additionally formed in the memory cell region.

Figure 2:
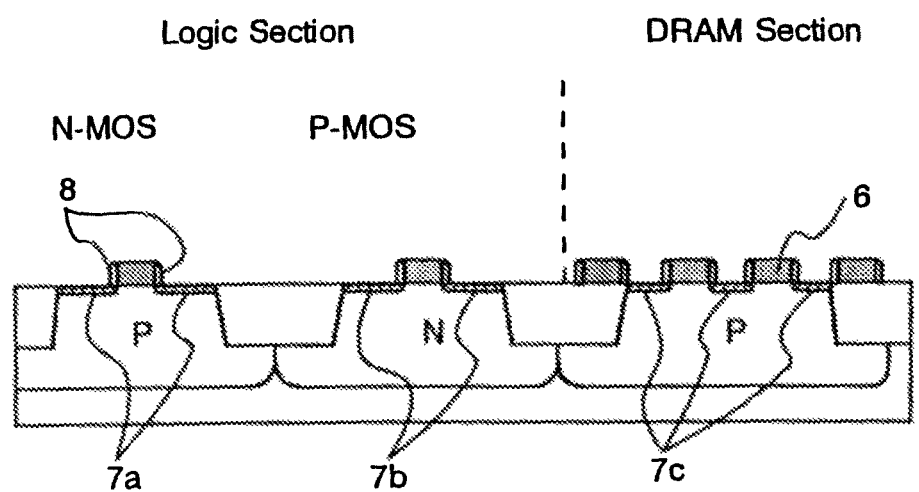

After removing the sacrifice oxide film, a gate oxide film (not shown in the drawing) is formed by another thermal oxidation. Hereat, it is preferable to make the gate oxide film thicker in the DRAM section than in the logic section. A polysilicon layer that is to serve as respective gates of all transistors is, then, formed over the entire surface and patterned into a prescribed shape of gate electrodes. After that, dopant ions are implanted thereinto so as to form LDD (Lightly-Doped Drain) regions 7a, 7b and 7c, in respective sections. Formation of the LDD regions 7a and 7c may be performed, hereat, simultaneously or separately. Subsequently, using TEOS or the like, an oxide film is grown over the entire surface by the CVD (Chemical Vapour Deposition) method and, through anisotropic etching, LDD sidewalls 8 are formed on lateral faces of gate electrodes (FIG. 2).

Figure 3:
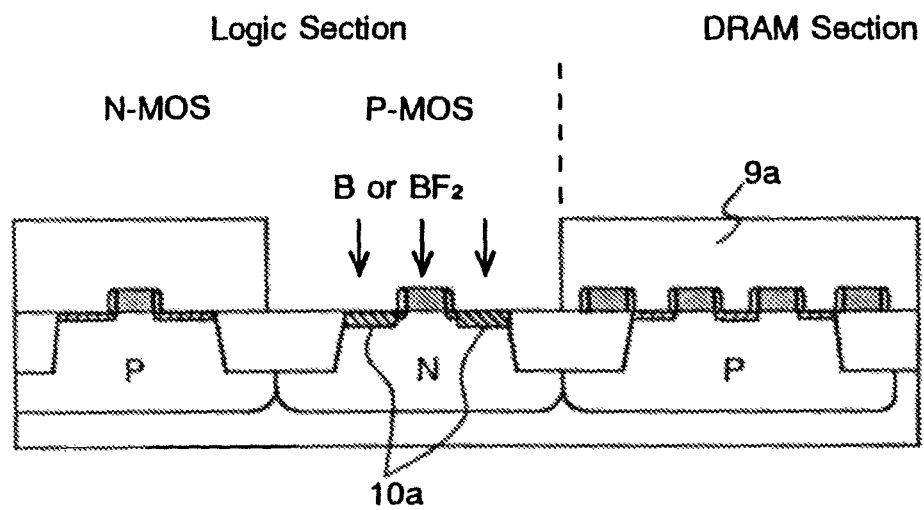

Next, as shown in FIG. 3, masking the N-MOS section and the DRAM section with a resist 9a, only the P-MOS section is left exposed, and p-type dopants such as B or $BF_2$ are ion-implanted for formation of the S/D regions 10a in the P-MOS section. For example, $BF_2$ is ion-implanted under the conditions that the accelerating voltage is 20 keV and the dose is 3E15 or so. Hereat, the gate polysilicon is also subjected to the ion implantation simultaneously and, as a result, becomes a P-gate.

Figure 4:
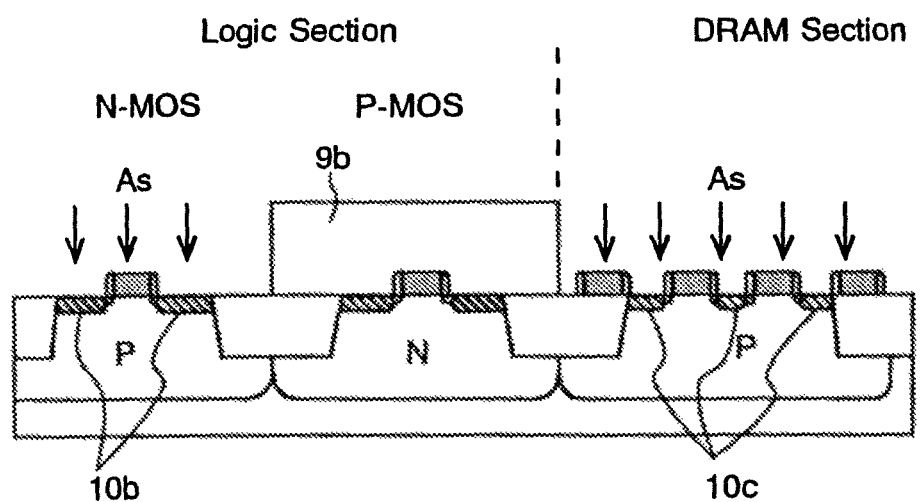

Next, as shown in FIG. 4, a resist 9b is formed only in the P-MOS section, and n-type dopants such as P or As are ion-implanted into the N-MOS section and the DRAM section, for example, As is ion-implanted at 50 keV to a dose of 3E15-6E15 or so, thus forming S/D regions 10b and 10c, respectively. Hereat, the gate polysilicons are also subjected to the ion implantation simultaneously and, as a result, become N-gates. In effect, there are formed so-called P-N gates in which the P-ch has a P-gate and the N-ch an N-gate. After that, for example, the RTA (Rapid Thermal Annealing) (ramp annealing) is performed at 1000° C. for 10 seconds or so, and the implanted dopants are activated. While ion-implantation is, hereat, applied to the N-MOS section and the DRAM section at the same time, it can be applied to each in separate steps.

Figure 5:
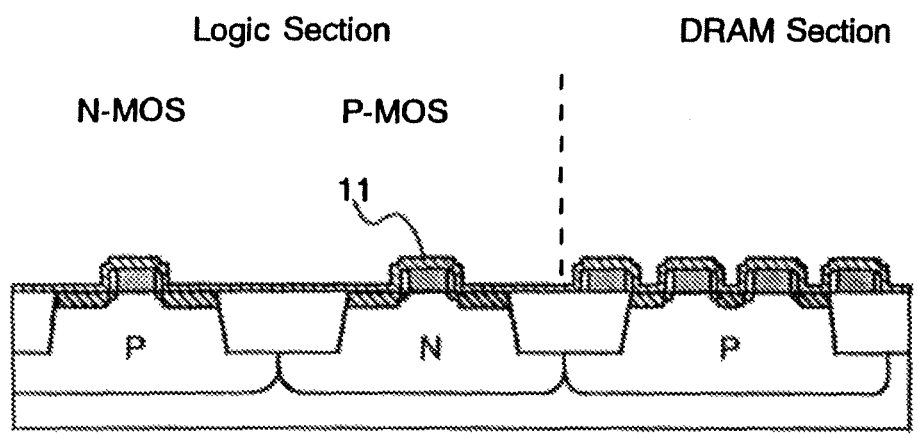

Next, as shown in FIG. 5, a metal film for silicidation is grown over the entire surface by the sputtering method or the like. Here, an example in which a cobalt (Co) film 11 is grown is shown. However, the present invention is not limited to this and any metal material that can form silicide through a thermal reaction with silicon, such as titanium and nickel, can be utilized in the same manner.

Figure 6:
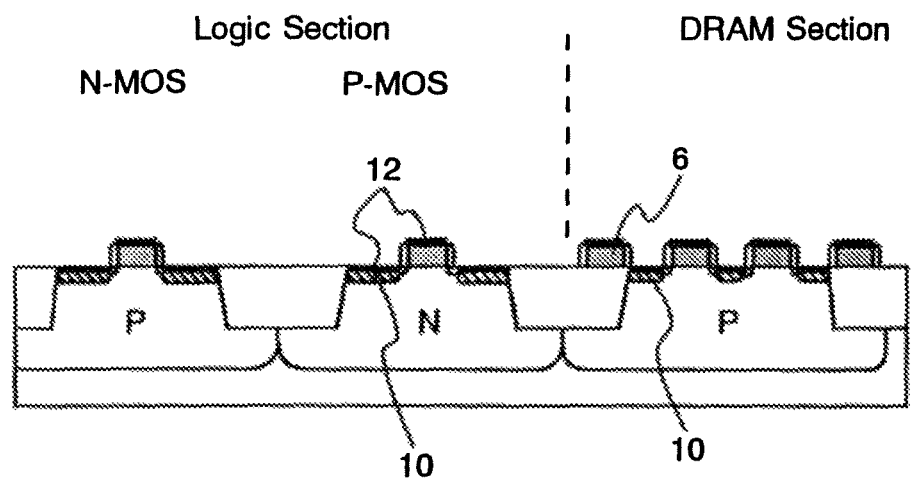

Next, the unreacted Co film 11 is removed by a heat treatment. For example, a heat treatment in $N_2$ gas atmosphere at a temperature of 500-600° C. or so is applied thereto for 30 seconds and then the unreacted Co film is removed with a mixed solution of sulfuric acid and hydrogen peroxide, and another heat treatment in the nitrogen gas atmosphere at 800° C. is further applied thereto for 10 seconds or so (the so-called salicide method), which results in formation of cobalt silicide ($COSi_2$) 12 over all the surfaces of the S/D regions (10) and on the gate electrodes (6), as shown in FIG. 6.

Figure 7:
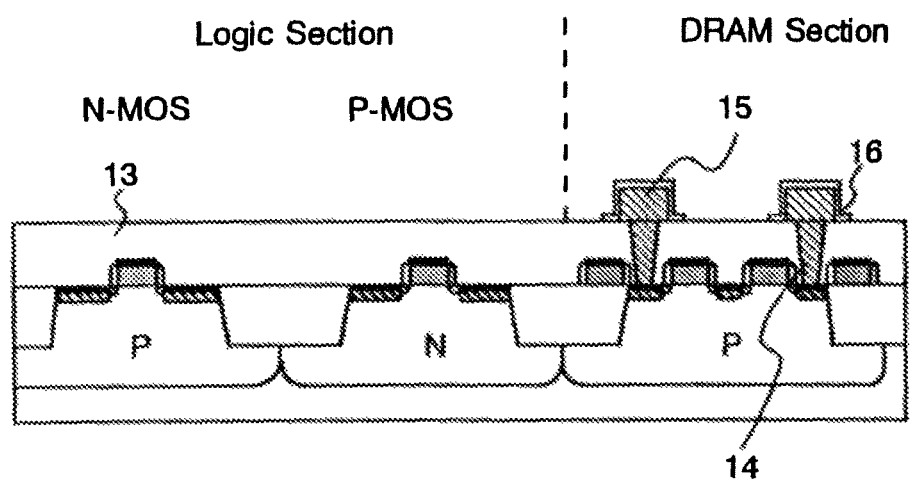

Subsequently, in the same way as the prior art, a first interlayer film 13 is formed and thereafter contact holes to connect to capacitor electrodes are formed in the DRAM section, and then, by filling up the contact holes with a metal or a polysilicon, capacitor contacts 14 are formed. Lower electrodes 15, capacitor insulating films which are omitted from the drawing and upper electrodes 16 are then formed to accomplish capacitor electrodes (FIG. 7). Although stacked-type capacitor electrodes are, herein, shown as lower electrodes, the present invention is, in no way, limited by this, and can have known cylindrical electrodes or electrodes with an even more complicated structure for them. When utilizing polysilicon, HSG (Hemispherical Silicon Grain) electrodes can be also employed. Further, the capacitor contacts, lower electrodes and upper electrodes may be formed, using a known material such as Ti/TiN/W or the like. In short, the material, the structure and such can be selected appropriately for them according to design.

Figure 8:
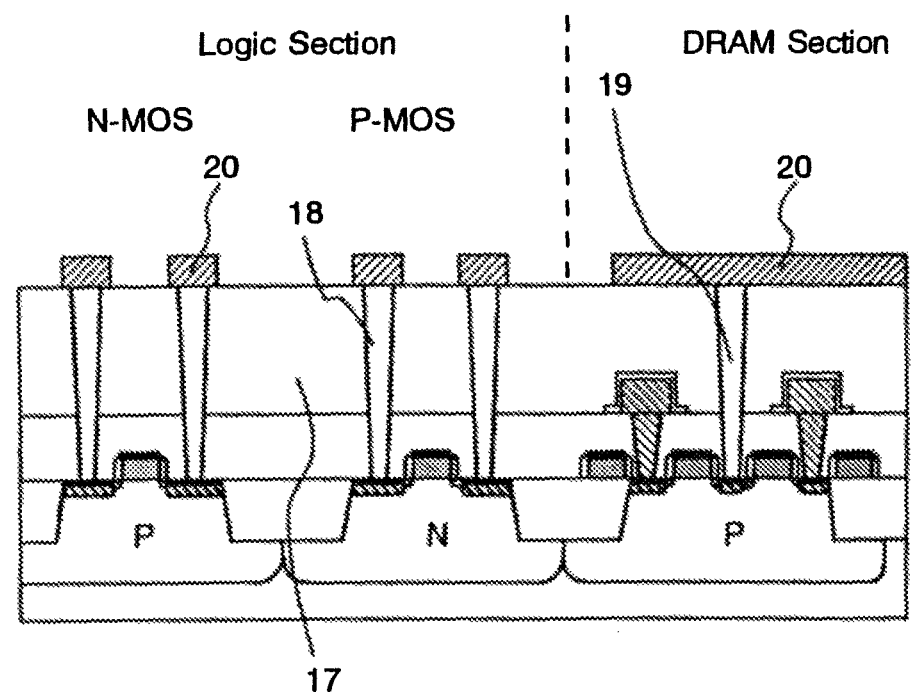
Figure 9:
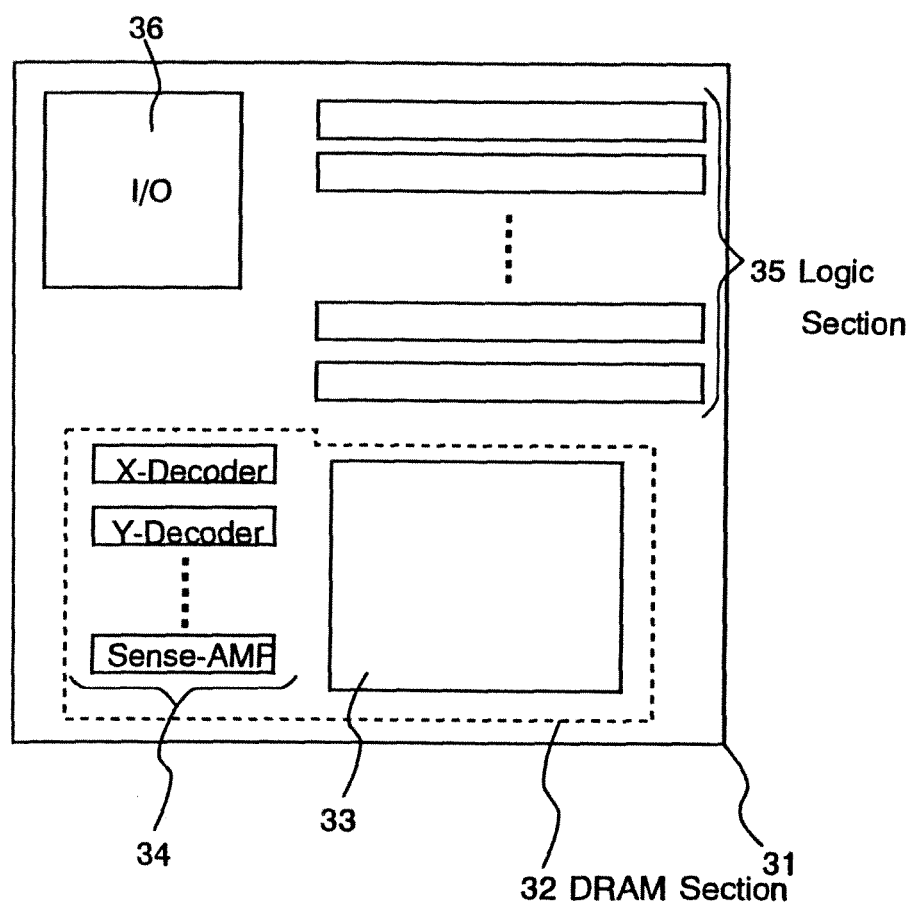
FIG. 9 is a schematic view showing an example of the structure of a SOC having a DRAM on board.
Figure 10:
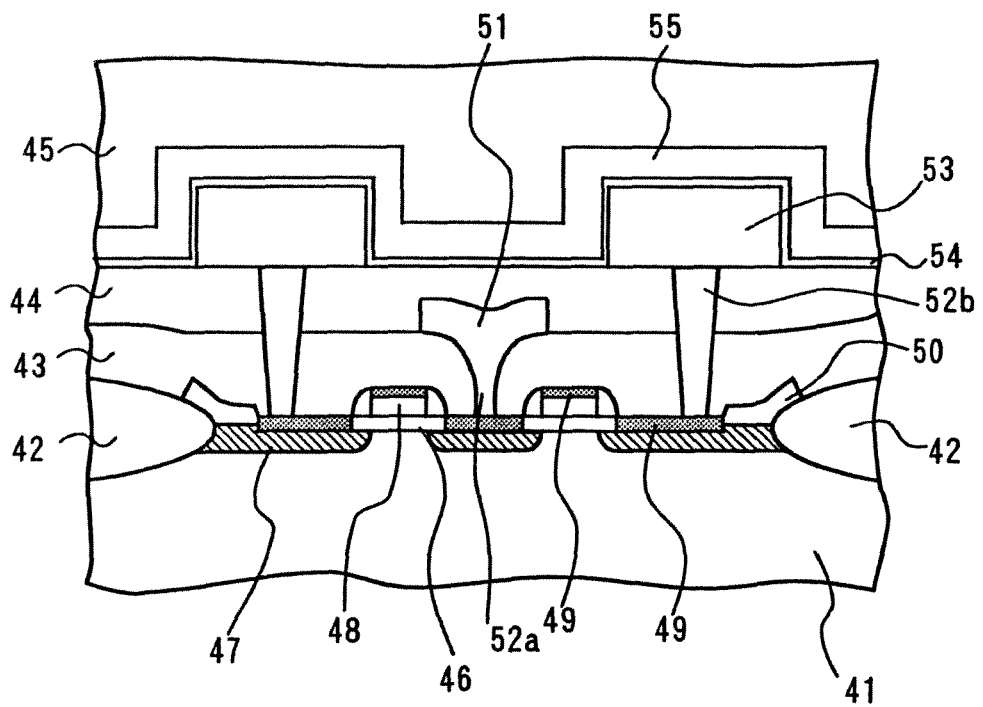
FIG. 10 is a cross-sectional view showing a conventional DRAM cell section.

Following this, as shown in FIG. 8, after a second interlayer film 17 is formed, contacts 18 each connecting with one region of the S/D regions of transistors in the logic section and a bit line contact 19 connecting with the DRAM section are formed, using a known metal material such as Ti/TiN/W or the like. Next, a known interconnection material such as Al, TiN, W or the like is grown over the entire surface by the sputtering method and then patterned, whereby a first interconnection 20 that is also to serve as a bit line is formed. Obviously, the bit line and the first interconnection can be formed as different layers or from different materials.

Further, when forming contact holes, it is preferable to form an etching stopper layer on the substrate so that the pre-formed silicide layers may not be carved into at the time of etching.

What distinguishes the present invention from the conventional techniques the most is the fact that, even in the memory cell region of the DRAM section, there are formed the S/D regions with a high dopant concentration defined as $n^+$. When silicide is formed on the S/D regions with such a high dopant concentration, good ohmic contacts can be formed. Further, because the junction becomes deeper, the junction leakage current is hardly generated even if silicide is formed over all the surfaces of the S/D regions. In contrast with this, when silicide is formed on conventional low dopant-concentration regions ($n^-$), Schottkey contacts are formed therebetween, which is not adequate for the purpose of achieving lower resistance.

Further, by setting the S/D regions of the memory cell regions as high dopant-concentration regions, good ohmic contacts can be formed through silicidation, as described above, so that this invention can be readily put into practice. Moreover, as the present invention has a considerable effect of making the performance of the whole elements faster and the steps of a manufacturing method simpler, its technical significance cannot be overemphasized.

While, for the above description, a DRAM-incorporated SOC is given as an example, the present invention can be applied to a semiconductor device that does not have any logic section, that is, a semiconductor device having only a DRAM section. Further, the present invention can be applied to a semiconductor device having a DRAM cell section and an adjacent-circuit-functional element section, wherein silicide layers are formed over all the surfaces of the source-drain regions and the gate surfaces of transistors in the DRAM cell section and the adjacent-circuit-functional element section which comprises elements such as various decoders, sense amplifiers and the like. In this instance, too, silicidation of the DRAM cell section and the adjacent circuit section can be carried out concurrently in one and the same step, in accordance with the above description, and thereby both higher-speed performance of the whole elements and simplification of the manufacturing steps can be attained.

What is claimed is:

1. A semiconductor device comprising:
a semiconductor substrate comprising a dynamic random access memory (DRAM) portion and a logic portion thereon;
a first transistor formed in said DRAM portion and comprising source and drain regions and a metal silicide layer comprising one of cobalt silicide and nickel silicide formed on said source and drain regions;
a second transistor having a conductivity type which is the same as a conductivity type of the first transistor, and formed in said logic portion and comprising source and drain regions, said metal silicide layer being formed on said source and drain regions of said second transistor;
a third transistor formed in said logic portion and having a conductivity type which is different than the conductivity type of the first and second transistors, and comprising source and drain regions, said metal silicide layer being formed on said source and drain regions of said third transistor;
an interlayer film covering said DRAM portion and logic portion of said semiconductor substrate;
a capacitor formed on said interlayer film in said DRAM portion and comprising a lower electrode; and
plural contact plugs, said plural contact plugs being formed in said interlayer film in said DRAM portion and said logic portion,
wherein said source and drain regions of said first, second and third transistors comprise respective first and second diffusion regions, said second diffusion region comprising a lightly-doped region and said first diffusion region comprising a highly-doped region having
an impurity density which is greater than an impurity density of said second diffusion region,
wherein said metal silicide layer is formed on a substantially entire surface of said highly-doped region of said source and drain regions of said first, second and third transistors in the DRAM and logic portions, an interface between said metal silicide layer and said substantially entire surface of said highly-doped region of said source and drain regions of the first, second and third transistors in said DRAM portion and said logic portion being located under a main surface of said substrate,
wherein said plural contact plugs are in contact with said metal silicide layer on said highly-doped region of said source and drain regions of said first, second and third transistors in said DRAM portion and said logic portion, and comprise a capacitor contact which is in contact with said lower electrode of said capacitor, an interface between said plural contact plugs and said metal silicide layer being formed at said main surface in said DRAM portion and said logic portion,
wherein said metal silicide layer comprises a silicided surface of said semiconductor substrate,
wherein said plural contact plugs comprise a bit line contact formed on said metal silicide layer on said source and drain regions of said first, second and third transistors,
wherein each of said first, second and third transistors further comprises a gate electrode, said metal silicide layer being formed on said gate electrode, and
wherein the semiconductor device further comprises:

another interlayer film formed on said interlayer film and said capacitor, said bit line contact being formed in said interlayer film and said another interlayer film; and an interconnection which serves as a bit line and is formed on said another interlayer film and connected to said bit line contact.

2. The semiconductor device of claim 1, wherein said plural contact plugs comprise a metal.

3. The semiconductor device of claim 1, wherein said plural contact plugs are in physical contact with said metal silicide layer.

4. The semiconductor device according to claim 1, wherein said plural contact plugs are formed on a side of said metal silicide layer, and said source and drain regions of said first, second and third transistors are formed on another side of said metal silicide layer, such that said metal silicide layer intervenes between said plural contact plugs and said source and drain regions of said first, second and third transistors.

5. The semiconductor device according to claim 4, wherein said lower electrode of said capacitor comprises a first metal, and said capacitor further comprises a dielectric layer formed on said lower electrode and an upper electrode comprising a second metal and formed on said dielectric layer.

6. The semiconductor device according to claim 5, wherein a thickness of said metal silicide layer formed on said source and drain regions of said first transistor in the DRAM portion is substantially equal to the thickness of said metal silicide layer formed on source and drain regions of said logic portion.

7. The semiconductor device according to claim 6, wherein said source and drain regions of said first transistor and said source and drain regions of said second transistor comprise substantially equal dopant-concentrations.

8. The semiconductor device according to claim 6, wherein said plural contact plugs comprise a material selected from the group consisting of Ti, TiN and W.

9. The semiconductor device according to claim 6, wherein each of said lower and upper electrodes comprises a material selected from the group consisting of Ti, TiN and W.

10. The semiconductor device according to claim 1, wherein said capacitor is formed in said DRAM portion of said semiconductor device.

11. The semiconductor device according to claim 1, wherein a part of said second diffusion region is not covered with said metal silicide layer.

12. The semiconductor device according to claim 1, wherein the metal silicide layer of the first transistor extends on the source and drain regions of the first transistor from the lightly-doped region of the source and drain regions to another lightly-doped region of another transistor formed in said DRAM portion.

13. The semiconductor device according to claim 1, wherein each of the gate electrodes of the first and second transistors comprises polysilicon which is doped with an impurity which is the same as an impurity in said source and drain regions of the first and second transistors.

14. The semiconductor device of claim 1, wherein the capacitor further comprises an upper electrode and the another interlayer film is formed on the upper electrode of the capacitor.

15. A semiconductor device comprising:
a semiconductor substrate comprising a dynamic random access memory (DRAM) portion and a logic portion thereon;
a first transistor formed in said DRAM portion and comprising source and drain regions;
a second transistor having a conductivity type which is the same as a conductivity type of the first transistor, and formed in said logic portion and comprising source and drain regions;
a third transistor formed in said logic portion and having a conductivity type which is different than the conductivity type of the first and second transistors, and comprising source and drain regions, the source and drain regions of the first, second and third transistors including respective first and second diffusion regions, said second diffusion region comprising a lightly-doped region and said first diffusion region comprising a highly-doped region having an impurity density which is greater than an impurity density of said second diffusion region;
a metal silicide layer comprising one of cobalt silicide and nickel silicide formed on a substantially entire surface of said highly-doped region of said source and drain regions of said first, second and third transistors, an interface between said metal silicide layer and said substantially entire surface of said highly-doped region of said source and drain regions in said first, second and third transistors being located under a main surface of said substrate;
an interlayer film covering said DRAM portion and logic portion of said semiconductor substrate; and
plural contact plugs, said plural contact plugs being formed in said interlayer film in said DRAM portion and said logic portion, said plural contact plugs being in contact with said metal silicide layer on said highly-doped region of said source and drain regions of said first, second and third transistors in said DRAM portion and said logic portion, an interface between said plural contact plugs and said metal silicide layer being formed at said main surface in said DRAM portion and said logic portion,
wherein said metal silicide layer comprises a silicided surface of said semiconductor substrate,
wherein said plural contact plugs comprise a bit line contact formed on said metal silicide layer on said source and drain regions of said first, second and third transistors,
wherein each of said first, second and third transistors further comprises a gate electrode, said metal silicide layer being formed on said gate electrode, and
wherein the semiconductor device further comprises:
another interlayer film formed on said interlayer film and said upper electrode of said capacitor, said bit line contact being formed in said interlayer film and said another interlayer film; and
an interconnection which serves as a bit line and is formed on said another interlayer film and connected to said bit line contact.

16. The semiconductor device of claim 15, further comprising:
a first P-type well formed in substrate in the DRAM portion, the source and drain regions of the first transistor being formed in the P-type well;
a second P-type well formed in the substrate in the logic portion, the source and drain regions of the second transistor being formed in the second P-type well; and
an N-type well formed in the substrate in the logic portion, the source and drain regions of the third transistor being formed in the N-type well.

17. The semiconductor device of claim 16, further comprising:
an oxide film formed in the first P-type well and the N-type well at the main surface of the substrate, the oxide film separating a first portion of the metal silicide layer formed in the DRAM portion from a second portion of the metal silicide layer formed in the logic portion.

\* \* \* \* \*